(12) United States Patent
Chuo et al.

(10) Patent No.: US 8,283,575 B2
(45) Date of Patent: Oct. 9, 2012

(54) FLEXIBLE-CIRCUIT FLAT CABLE WITH CLUSTER SECTION

(75) Inventors: Chih-Heng Chuo, Zhongli (TW); Gwun-Jin Lin, Taoyuan (TW); Kuo-Fu Su, Zhongli (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 635 days.

(21) Appl. No.: 12/458,902

(22) Filed: Jul. 27, 2009

(65) Prior Publication Data
US 2010/0294556 A1    Nov. 25, 2010

(30) Foreign Application Priority Data

May 22, 2009    (TW) ................................ 98117011 A

(51) Int. Cl.
*H05K 1/00*    (2006.01)
(52) U.S. Cl. ....................... 174/268; 174/254
(58) Field of Classification Search ................ 174/268, 174/254; 361/749–751
See application file for complete search history.

(56) References Cited

U.S. PATENT DOCUMENTS

| 6,433,284 B1 * | 8/2002 | Lin et al. ........................ 174/254 |
| 2010/0188826 A1 * | 7/2010 | Yeh ................................. 361/749 |

* cited by examiner

*Primary Examiner* — Jeremy Norris
(74) *Attorney, Agent, or Firm* — Rosenberg, Klein & Lee

(57) ABSTRACT

Disclosed is a flexible-circuit flat cable with cluster section, including at least one cluster section, at least one slip section, a first connection section, and a second connection section. The first connection section is set at a first end of the cluster section. The slip section has a first end connected to a second end of the cluster section and a second end at which the second connection section is set. The four sections are all provided with a plurality of signal transmission lines corresponding to and connecting each other. The first connection section and the second connection section are selectively provided with a connector or a plugging end. Further, the cluster section includes a cluster structure composed of a plurality of clustered flat cable components that are formed by slitting in a direction parallel to extension direction of a flexible circuit board to impose free and independent flexibility for bending to each clustered flat cable component.

22 Claims, 12 Drawing Sheets

FLEXIBLE-CIRCUIT FLAT CABLE WITH CLUSTER SECTION

FIELD OF THE INVENTION

The present invention relates to a circuit flat cable, and in particular to a flexible-circuit flat cable with cluster section and slip section.

BACKGROUND OF THE INVENTION

Among the state-of-the-art printed circuit board techniques, a flexible printed circuit (FPC) is the most promising one, which features light weight, small volume, dynamic flexibility, and resilient deformability and is fit for various assembling conditions for products of all types of outside configurations for providing characteristics of increasing layout density of wiring and flexibility of bending to serve as a circuit carrier for signal communication and/or coupling of components. Since an FPC can be connected with active and passive components or modularized devices, the FPC also possesses mechanical features.

In the past decade, the FPCs have been widely applied to various system products, especially thin and light-weighted electronic products. For example, consumer electronic products, such as mobile phones, digital cameras, computer peripherals, flat panel displays, and game devices, all find application of FPCs. Besides being endowed with a high growth rate in the field of panel displays and consumer electronic products, technology that employs FPCs as medium of transmission also makes a great and un-erasable contribution to the development of the electronic industry.

The FPCs often serve as signal connection means in a foldable and/or rotatable part of an electronic device. The most commonly known application of the FPC is found in a hinge part of an electronic device, such as clamshell devices, slip devices, flip devices, and even three-dimensional rotation devices, which contribute the greatest product value to the application of the FPC in electronic devices. With the fast development and change of technology, the outside configuration and the function-related designs of electronic devices get diversified, so that the structural design of the FPC must be versatile.

SUMMARY OF THE INVENTION

However, the structure of the conventional flexible printed circuits (FPCs) is limited to the application for clamshell devices, slip devices, flip devices, or three-dimensional rotation devices. In many applications of electronic or communication devices, it is commonly found that an FPC is set in a hinge or rotational axle that defines a bore. The structure of the rotational axle can be a one-axis structure or a two-axis structure. For example, a slip type mobile phone has a slip screen that uses a single- or one-axis rotational axle as a component that receives and carries an FPC, and a digital camera having rotary screen uses a two-axis rotational axle as a component that receives and carries an FPC.

With the continuous development of technology, integrated electronic or communication devices that comprise a slip screen and a rotary screen are available in the market. Although the conventional FPCs can be used in these integrated electronic devices, yet for rotary components of the devices, the conventional design of flat cables imposes undesired interference with the operation of the rotational axle, causing compression, impact, or abrasion of a bent sites or corners of the flat cables and eventually damaging the flat cables and shortening the lifespan of the electronic devices.

Thus, an objective of the present invention is to provide a flexible-circuit flat cable with cluster section, which overcomes the drawbacks of the conventional flat cable in the applications thereof in the above discussed integrated electronic or communication devices.

The solution adopted in the present invention to overcome the problems of the conventional techniques comprises a flexible-circuit flat cable with cluster section, which comprises at least one cluster section, at least one slip section, a first connection section, and a second connection section. The first connection section is set at a first end of the cluster section. The slip section has a first end connected to a second end of the cluster section and a second end at which the second connection section is set. The four sections are all provided with a plurality of signal transmission lines corresponding to and connecting each other. The first connection section and the second connection section are selectively provided with a connector or a plugging end to meet the needs of signal for various circuits. Further, the cluster section includes a cluster structure composed of a plurality of clustered flat cable components that is formed by slitting in a direction parallel to extension direction of a flexible circuit board to impose free and independent flexibility for bending to each clustered flat cable component.

Further, in a preferred embodiment of the present invention, the first and second ends of the slip section each form at least one additional cluster section or alternatively, the first end of the cluster section forms at least one additional slip section, or further alternatively, the two ends of the cluster section each forms at least one additional connection section, in order to suit the needs of various applications and uses.

The technical solution adopted in the present invention provides a cluster section and a slip section in a flexible-circuit flat cable so that the problems of damage caused by compression, impact, or abrasion of a bent site of a conventional flat cable occurring in a rotational axle of a rotary screen of an integrated electronic or communication device composed of slip screen and rotary screen can be effectively alleviated.

Since the clustered flat cable components of the cluster section of the flexible-circuit flat cable are each allowed for independent free flexing, when the clustered flat cable components that are bundled together with the bundling structure is placed in a predetermined space for free movement, the problems of abrasion, compression, or impact caused by the rotational axle only apply to the bundling structure, not the clustered flat cable. Further, the bundling structure may be arranged to have various configurations and sizes for bundling purposes in order to allow the clustered flat cable components to freely move inside the bundling structure. Or alternatively, it can be designed to carry out direct bundling for forming a bundle to be fit for various rotation operations.

The integrated design of the present invention improves the problems faced by the conventional circuit-based flat cable and also provides a structural breakthrough, showing a novel way for the future development of electronic and/or communication devices.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
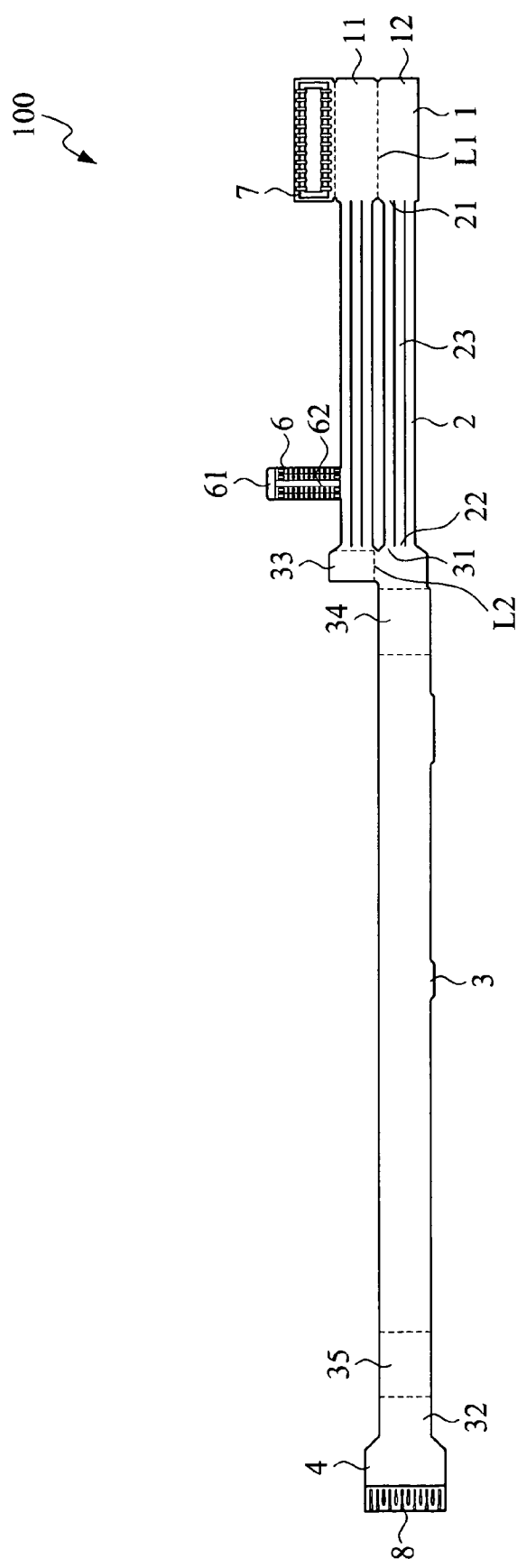
FIG. 1 is a schematic view of a flexible-circuit flat cable constructed in accordance with a first embodiment of the present invention.
Figure 2:
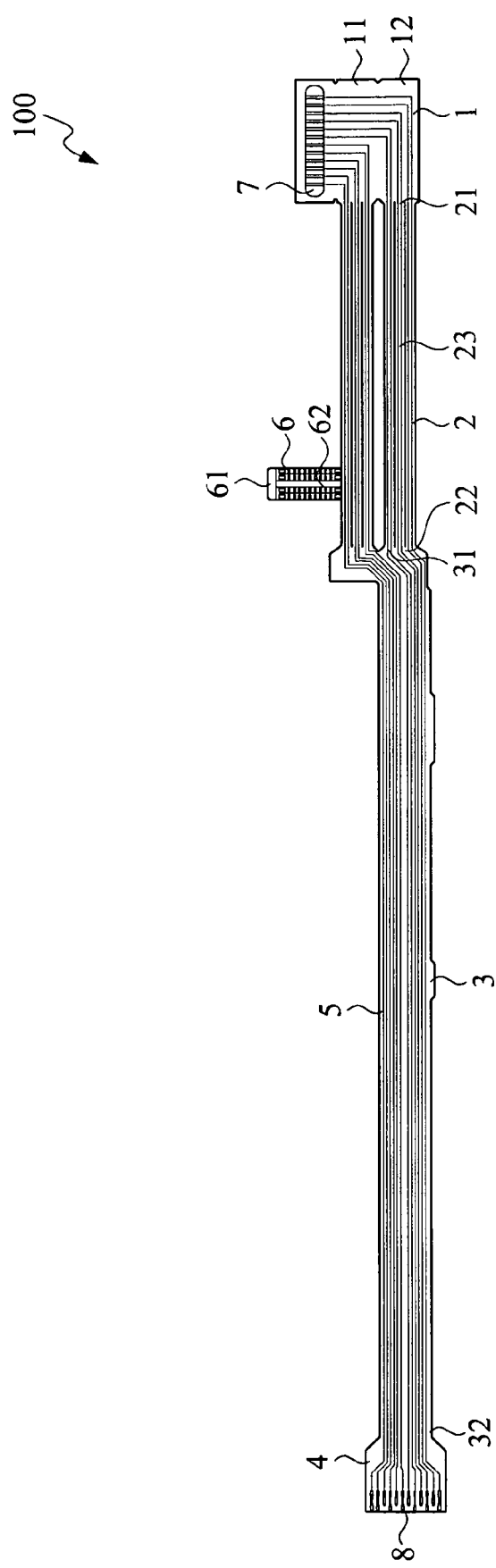
FIG. 2 is a bottom view of the flexible-circuit flat cable of the first embodiment of the present invention.

With reference to the drawings and in particular to FIGS. 1 and 2, FIG. 1 is a schematic view of a flexible-circuit flat cable constructed in accordance with a first embodiment of the present invention and FIG. 2 is a bottom view of the flexible-circuit flat cable of the first embodiment. The flexible-circuit flat cable of the present invention, generally designated at 100 in the drawings, comprises at least a first connection section 1, at least one cluster section 2, at least one slip section 3, and a second connection section 4. The cluster section 2 comprises a first end 21 and a second end 22. A plurality of signal transmission lines 5 are laid between the first end 21 and the second end 22.

The first connection section 1 comprises a first foldable section 11 and a second foldable section 12. A folding line L1 is formed between the first foldable section 11 and the second foldable section 12. The first end 21 of the cluster section 2 is set at side edges of the first foldable section 11 and the second foldable section 12. The first connection section 1 comprises a plurality of signal transmission lines 5 set therein and connected to corresponding ones of the signal transmission lines 5 of the cluster section 2. The first connection section 1 comprises a connector 7 connecting the signal transmission lines 5. In practical applications, other types of signal connection can be instead used to meet various needs of different circuits, such as a plugging end for plugging in a mating socket in a circuit. The plugging end can be of a plugging structure composed of a plurality of plugging pins, such as Gordon finger or a plugging structure composed of sculptures.

As shown, the cluster section 2 comprises a cluster structure composed of a plurality of clustered flat cable components 23 that is formed by slitting in a direction parallel to an extension direction of the flexible-circuit flat cable 100 to impose free and independent flexibility for bending to each clustered flat cable component 23. Each clustered flat cable component 23 comprises therein at least one signal transmission line 5. At least one bundling structure 6 is formed on a lateral side edge of a predetermined clustered flat cable component 23 of the cluster section 2. The bundling structure 6 forms a fastening section 61 and a hollow zone 62.

The slip section 3 comprises a first end 31 and a second end 32. The first end 31 of the slip section 3 is connected to the second end 22 of the cluster section 2. Between the first and second ends 31, 32 of the slip section 3, a plurality of signal transmission lines 5 are laid and connect the corresponding signal transmission lines 5 of the cluster section 2. Further, the slip section 3 comprises a folding line L2 and a plurality of adhering sections 33, 34, 35.

The second connection section 4 is arranged at the second end 32 of the slip section 3. The second connection section 4 also comprises a plurality of signal transmission lines 5 laid therein and connecting the corresponding signal transmission lines 5 of the slip section 3. The second connection section 4 comprises a plugging end 8 connecting the signal transmission lines 5. In practical applications, other types of signal connection can be instead used to meet various needs of different circuit signals, such as a connector, and this depends upon a designer's needs.

Figure 3:
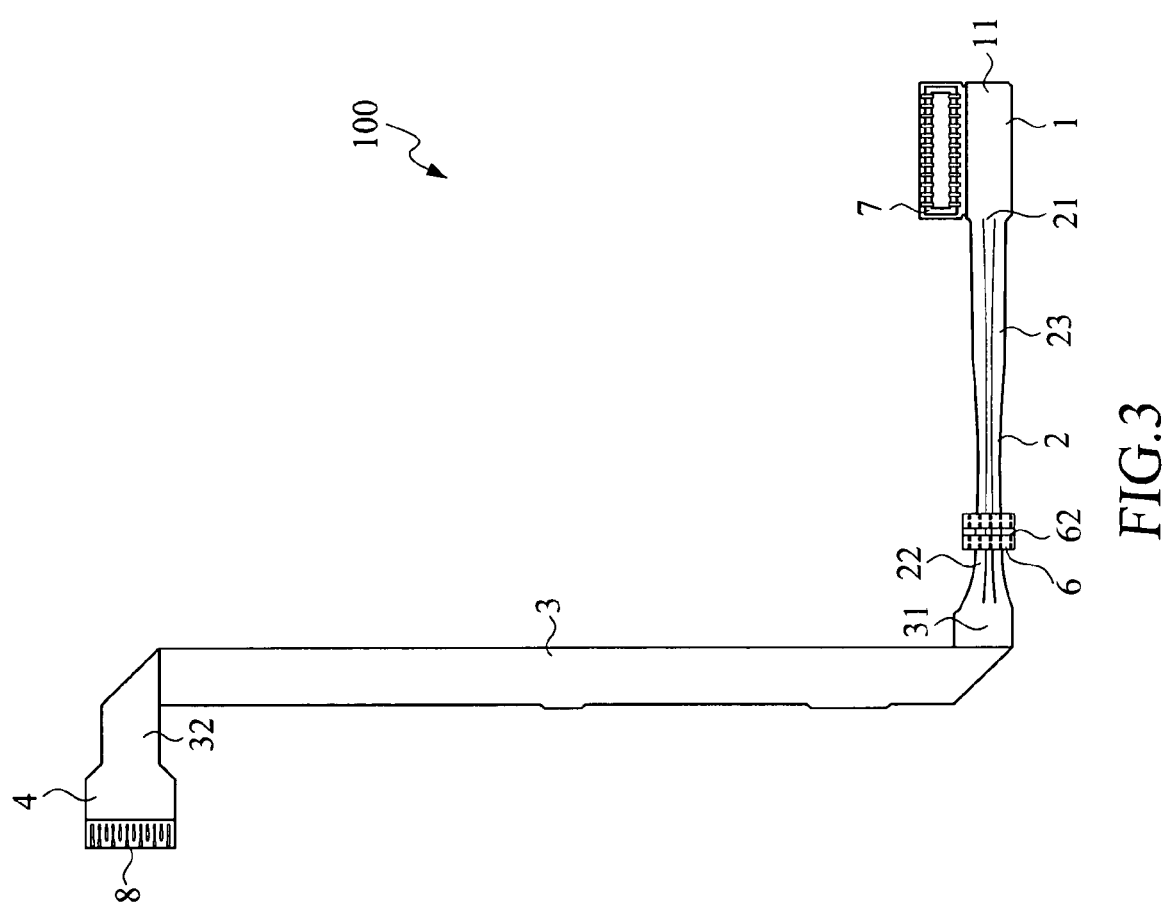
FIG. 3 is a schematic view showing use of the first embodiment of the present invention.

Referring to FIG. 3, a schematic view showing use of the first embodiment is given. With the folding line L1 of the first connection section 1 and the folding line L2 of the slip section 3, the second foldable section 12 is foldable to lap on a bottom surface of the first foldable section 11. With the adhering section 33 of the slip section 3, the portions that lap over each other are adhered to each other, so that the clustered flat cable components 23 of the cluster section 2 of the flexible-circuit flat cable 100 can be stacked in the form of a bundle as shown in the drawings. Afterwards, the bundling structure 6 is employed to bundle the clustered flat cable components 23 of the cluster section 2 together and the fastening section 61 of the bundling structure 6 fastens them together.

In the instant embodiment, the fastening section 61 of the bundling structure 6 comprises an adhesive layer, which adhesively secures a bundled structure of the stacked clustered flat cable components 23. The hollow zone 62 of the bundling structure 6 provides the clustered flat cable components 23 of the cluster section 2 with sufficient clearance for flexing and bending when the clustered flat cable components 23 are bundled together to form the bundled structure, and this prevents stress concentration occurring at a bent site of the flat cable due to insufficient flexing clearance and excessive shifting induced by rotation, and thus protects the cable components from entangling with each other, twisting, and thus being damaged.

The adhering sections 34, 35 of the slip section 3 function to adhesively secure portions of the slip section 3 of the flexible-circuit flat cable 100 when the slip section 3 is folded by a predetermined angle to have the portions overlapping each other as shown in the drawings. The arrangement and locations of the adhering sections 34, 35 as shown in the drawings are only an example of various feasible embodiments. The locations of the adhering sections 34, 35 are essentially dependent upon the structure and configuration of electronic devices to which the present invention is applied and can be alternatively omitted or preserved as desired. The present invention is not subjected to any constraints in this respect.

Figure 4:
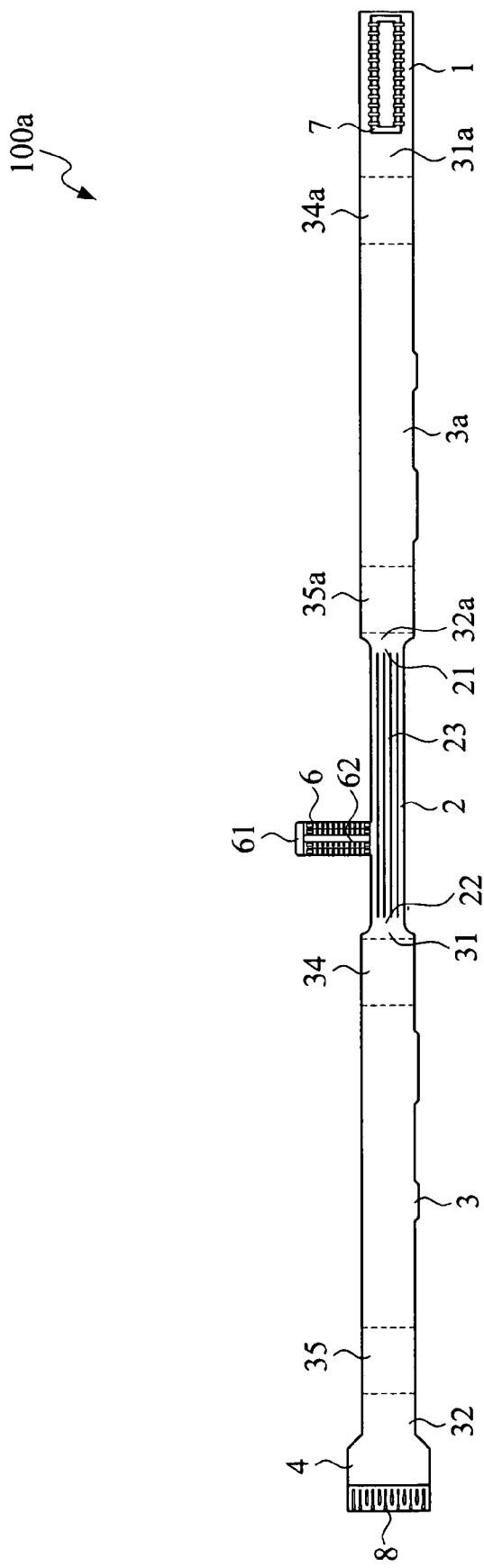
FIG. 4 is a schematic view of a flexible-circuit flat cable constructed in accordance with a second embodiment of the present invention.

Referring to FIG. 4, a schematic view of a flexible-circuit flat cable constructed in accordance with a second embodiment of the present invention is shown. The flexible-circuit flat cable of the second embodiment, generally designated at 100a, is substantially identical to the first embodiment in respect of the constituent components thereof, and thus identical components of the two embodiments will carry the same reference numerals for corresponding to each other. The difference between the two embodiments resides in that the first end 21 of the cluster section 2 forms at least one slip section 3a extending therefrom. The slip section 3a comprises a first end 31a and a second end 32a. The first end 31a of the slip section 3a is connected to the first connection section 1 and the second end 32a is connected to the first end 21 of the cluster section 2 to provide a configuration as shown in the drawings. The slip section 3a may selectively comprise a plurality of adhering sections 34a, 35a to selectively and adhesively secure portions of the slip section 3a that are folded and overlap each other. Apparently, addition or omission of the adhering sections 34a, 35a is completely dependent on design needs. Since the constituent components and the applications of the second embodiment are substantially identical to those of the first embodiment, further discussion is of no need herein.

Figure 5:
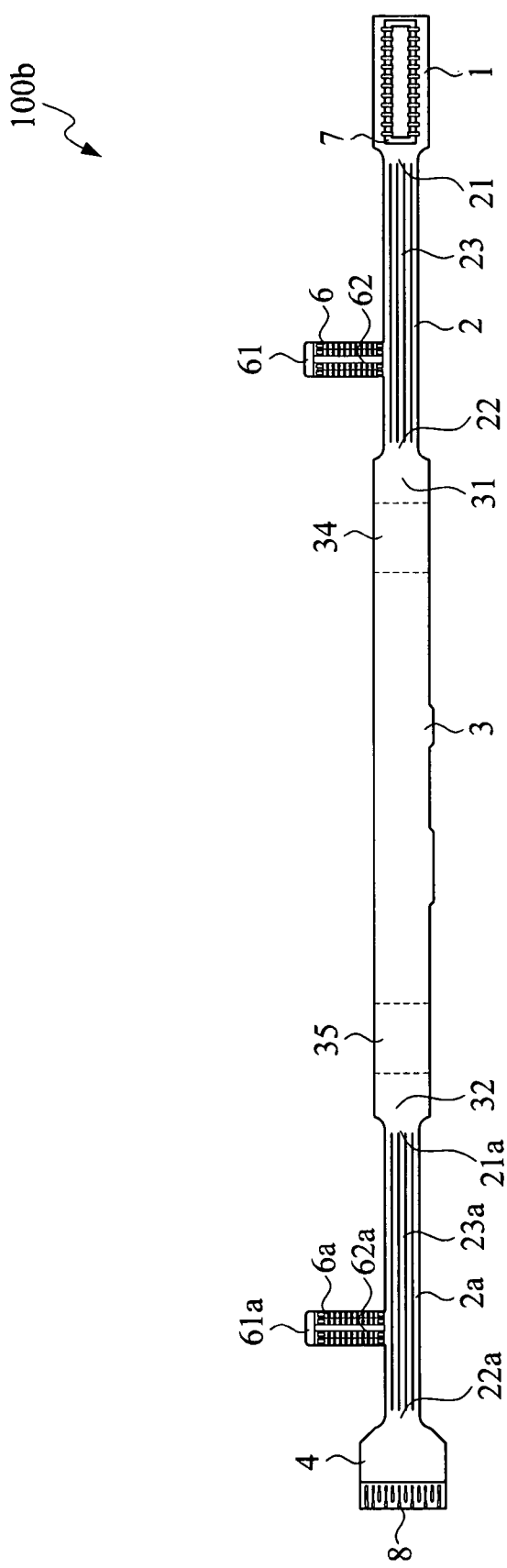
FIG. 5 is a schematic view of a flexible-circuit flat cable constructed in accordance with a third embodiment of the present invention.

Referring to FIG. 5, a schematic view of a flexible-circuit flat cable constructed in accordance with a third embodiment of the present invention is shown. The flexible-circuit flat cable of the third embodiment, generally designated at 100b, is substantially identical to the first embodiment in respect of the constituent components thereof, and thus identical components of the two embodiments will carry the same reference numerals for corresponding to each other. The difference between the two embodiments resides in that the second end 32 of the slip section 3 forms at least one cluster section 2a extending therefrom. The cluster section 2a has a first end 21a, a second end 22a and a plurality of clustered flat cable components 23a. The first end 21a of the cluster section 2a is connected to the second end 32 of the slip section 3 and the second connection section 4 is connected to the second end 22a of the cluster section 2a to provide a configuration as shown in the drawings. Since the constituent components and the applications of the third embodiment are substantially identical to those of the first embodiment, further discussion is of no need herein.

Figure 6:
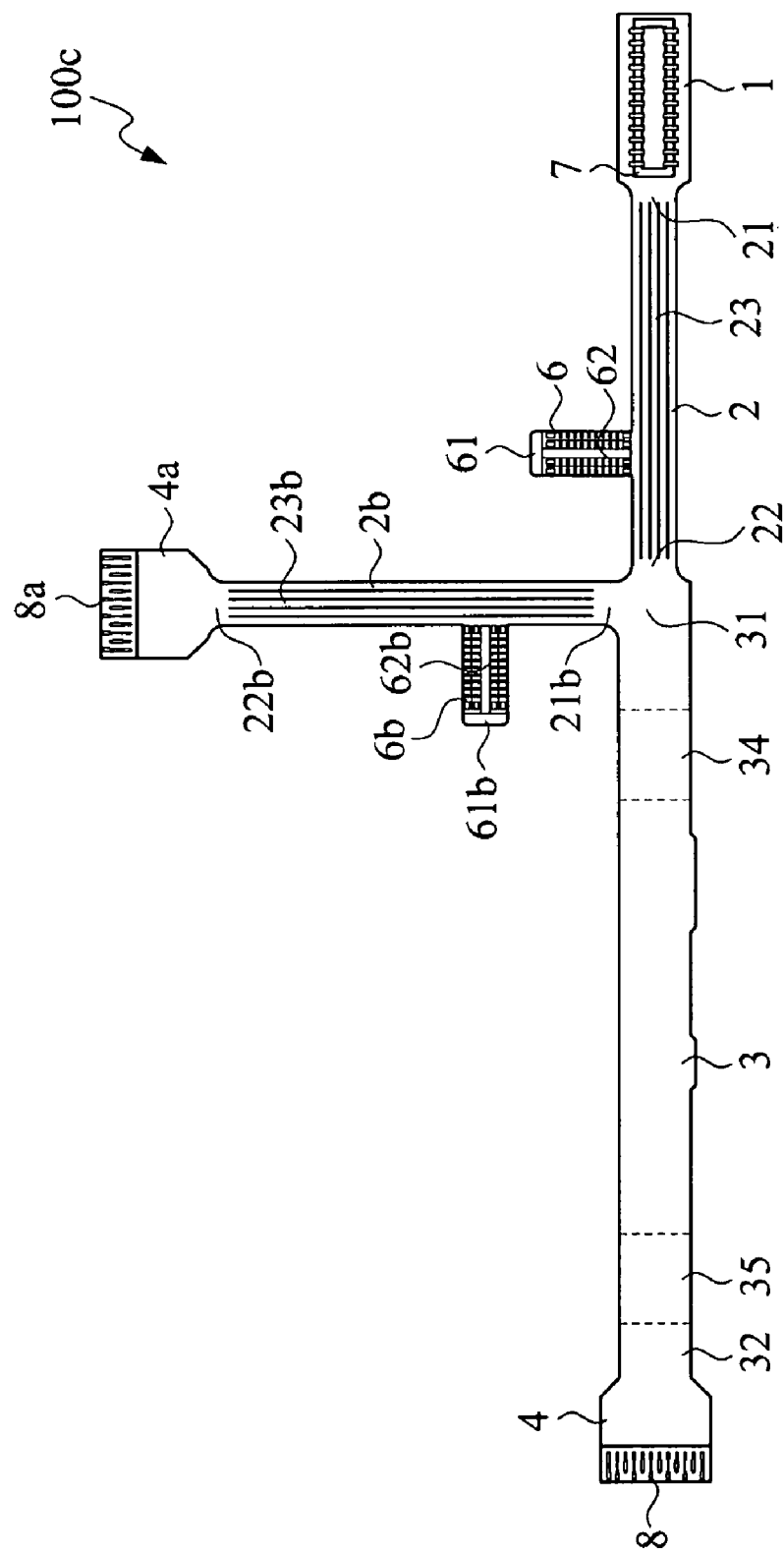
FIG. 6 is a schematic view of a flexible-circuit flat cable constructed in accordance with a fourth embodiment of the present invention.

Referring to FIG. 6, a schematic view of a flexible-circuit flat cable constructed in accordance with a fourth embodiment of the present invention is shown. The flexible-circuit flat cable of the fourth embodiment, generally designated at 100c, is substantially identical to the first embodiment in respect of the constituent components thereof, and thus identical components of the two embodiments will carry the same reference numerals for corresponding to each other. The difference between the two embodiments resides in that the first end 31 of the slip section 3 forms at least one additional cluster section 2b extending therefrom. The cluster section 2b has a first end 21b, a second end 22b and a plurality of clustered flat cable components 23b. The first end 21b of the cluster section 2b is connected to the first end 31 of the slip section 3 and the second end 22b of the cluster section 2b is connected to a third connection section 4a. In the instant embodiment, the third connection section 4a comprises a plugging end 8a connecting to signal transmission lines 5. In practical applications, other types of signal connection can be instead used to meet various needs of different circuit signals, such as a connector. Since the constituent components and the applications of the fourth embodiment are substantially identical to those of the first embodiment, further discussion is of no need herein.

Figure 7:
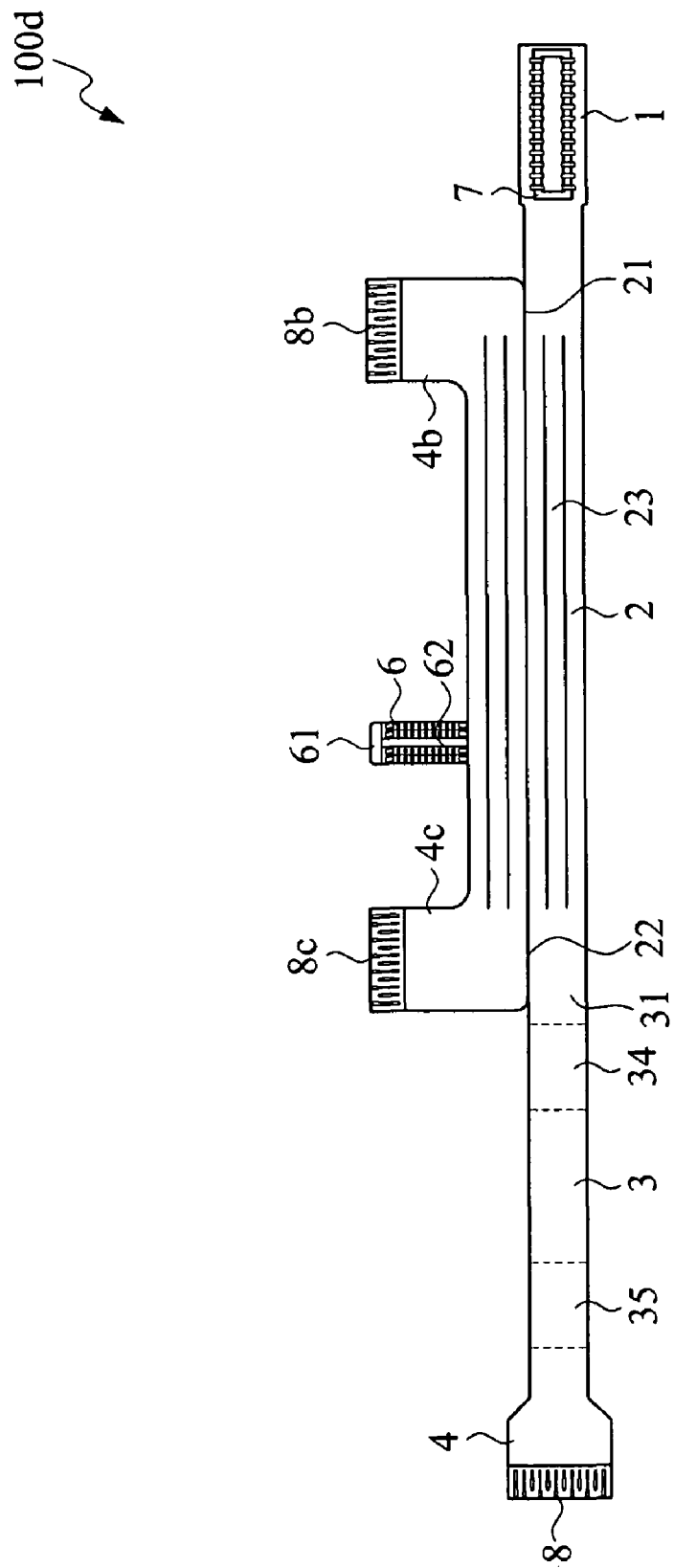
FIG. 7 is a schematic view of a flexible-circuit flat cable constructed in accordance with a fifth embodiment of the present invention.

Referring to FIG. 7, a schematic view of a flexible-circuit flat cable constructed in accordance with a fifth embodiment of the present invention is shown. The flexible-circuit flat cable of the fifth embodiment, generally designated at 100d, is substantially identical to the first embodiment in respect of the constituent components thereof, and thus identical components of the two embodiments will carry the same reference numerals for corresponding to each other. The difference between the two embodiments resides in that the first end 21 and the second end 22 of the cluster section 2 each forms a fourth connection section 4b and a fifth connection section 4c extending therefrom to provide a configuration as shown in the drawings. Each of the fourth and fifth connection sections 4b, 4c comprises a plugging end 8b, 8c connecting to signal transmission lines 5. In practical applications, other types of signal connection can be instead used to meet various needs of different circuit signals, such as a connector. Since the constituent components and the applications of the fourth embodiment are substantially identical to those of the first embodiment, further discussion is of no need herein.

Figure 8:
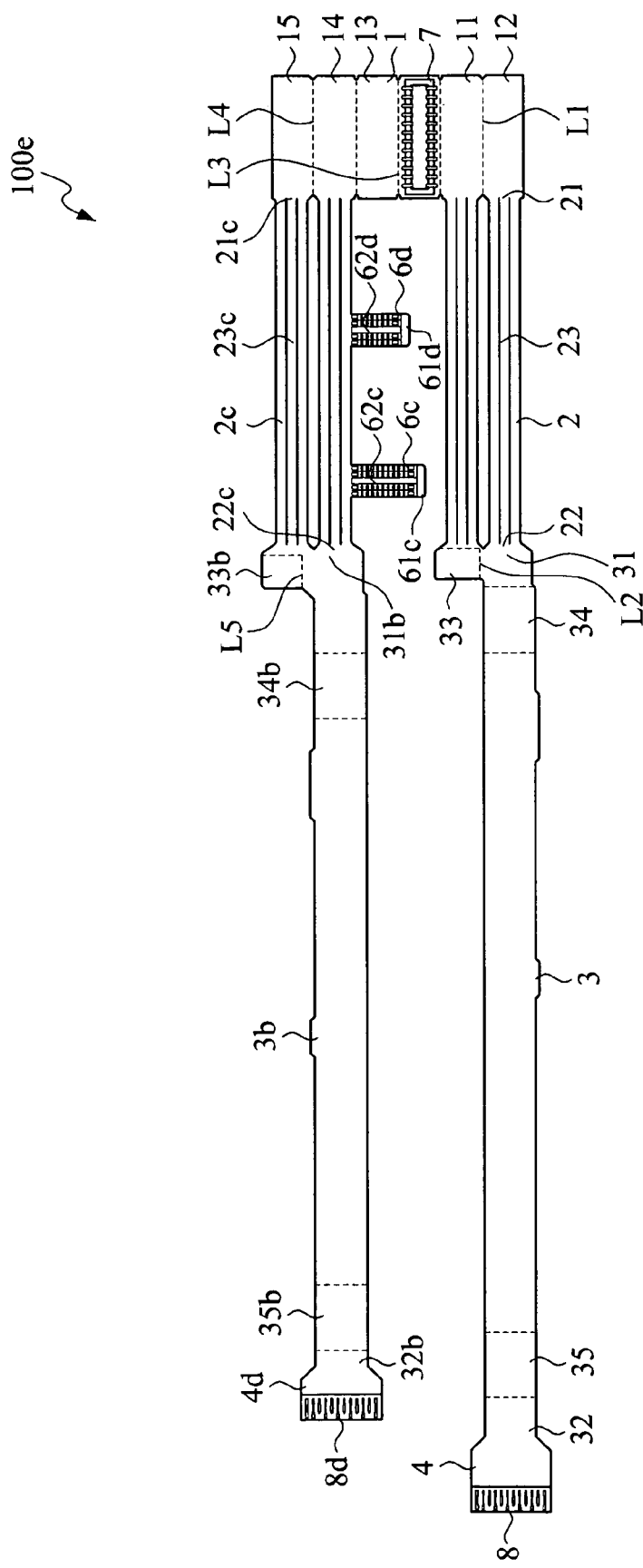
FIG. 8 is a schematic view of a flexible-circuit flat cable constructed in accordance with a sixth embodiment of the present invention.

Referring to FIG. 8, a schematic view of a flexible-circuit flat cable constructed in accordance with a sixth embodiment of the present invention is shown. The flexible-circuit flat cable of the sixth embodiment, generally designated at 100e, is substantially identical to the first embodiment in respect of the constituent components thereof, and thus identical components of the two embodiments will carry the same reference numerals for corresponding to each other. The difference between the two embodiments resides in that the first connection section 1 further comprises a third foldable section 13, a fourth foldable section 14, a fifth foldable section 15, and two folding lines L3, L4. A cluster section 2c is set at side edges of the fourth foldable section 14 and the fifth foldable section 15. A slip section 3b is connected to the cluster section 2c. A sixth connection section 4d is connected to the slip section 3b. Two bundling structures 6c, 6d are formed on a lateral side edge of a predetermined clustered flat cable component of the cluster section 2c. Each bundling structure 6c, 6d forms a fastening section 61c, 61d and a hollow zone 62c, 62. The sixth connection section 4d comprises a plugging end 8d.

Figure 9:
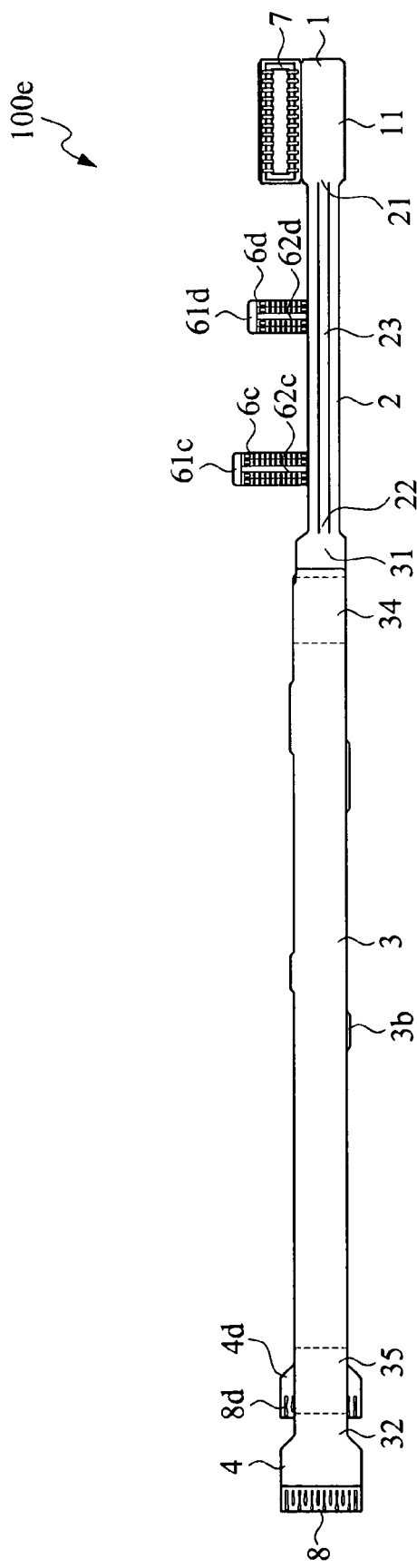
FIG. 9 is a schematic view showing use of the sixth embodiment of the present invention.
Figure 10:
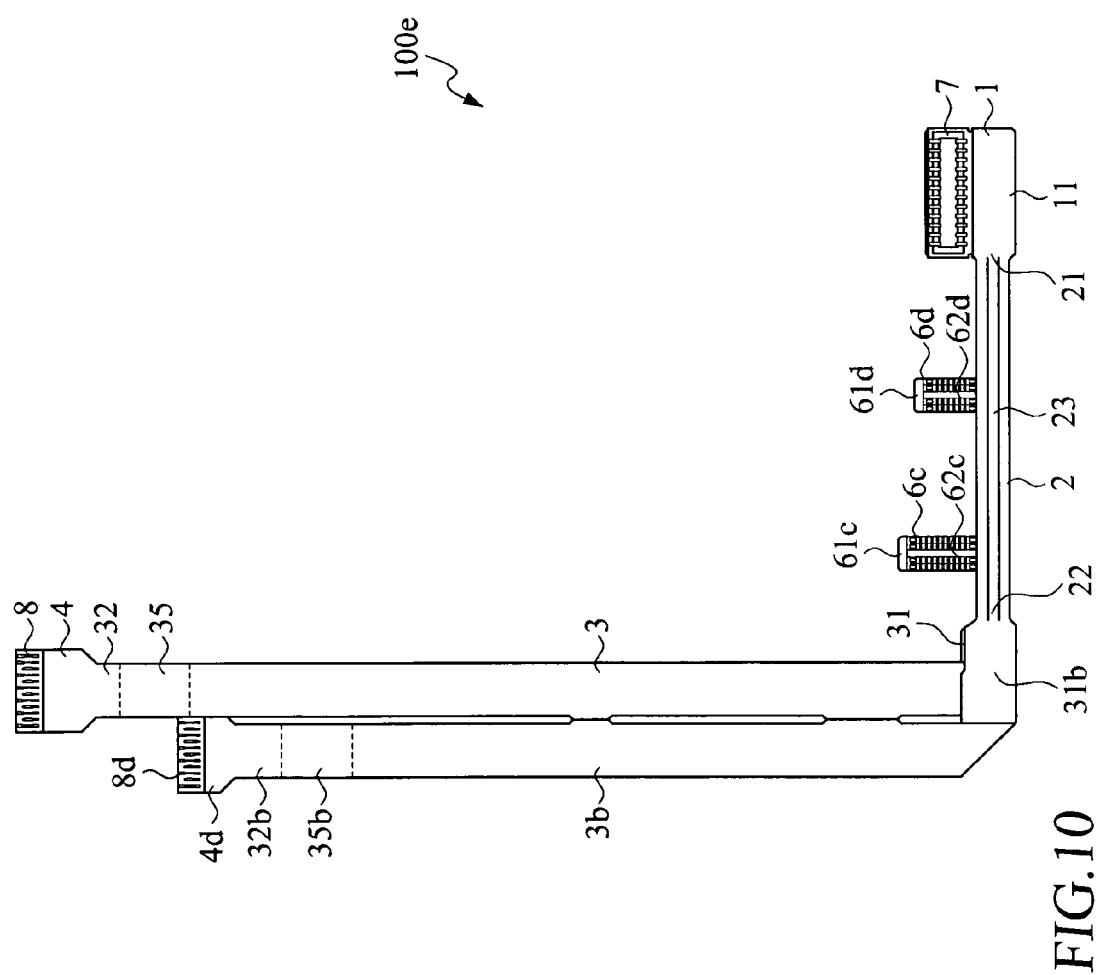
FIG. 10 is another schematic view showing the use of the sixth embodiment of the present invention.
Figure 11:
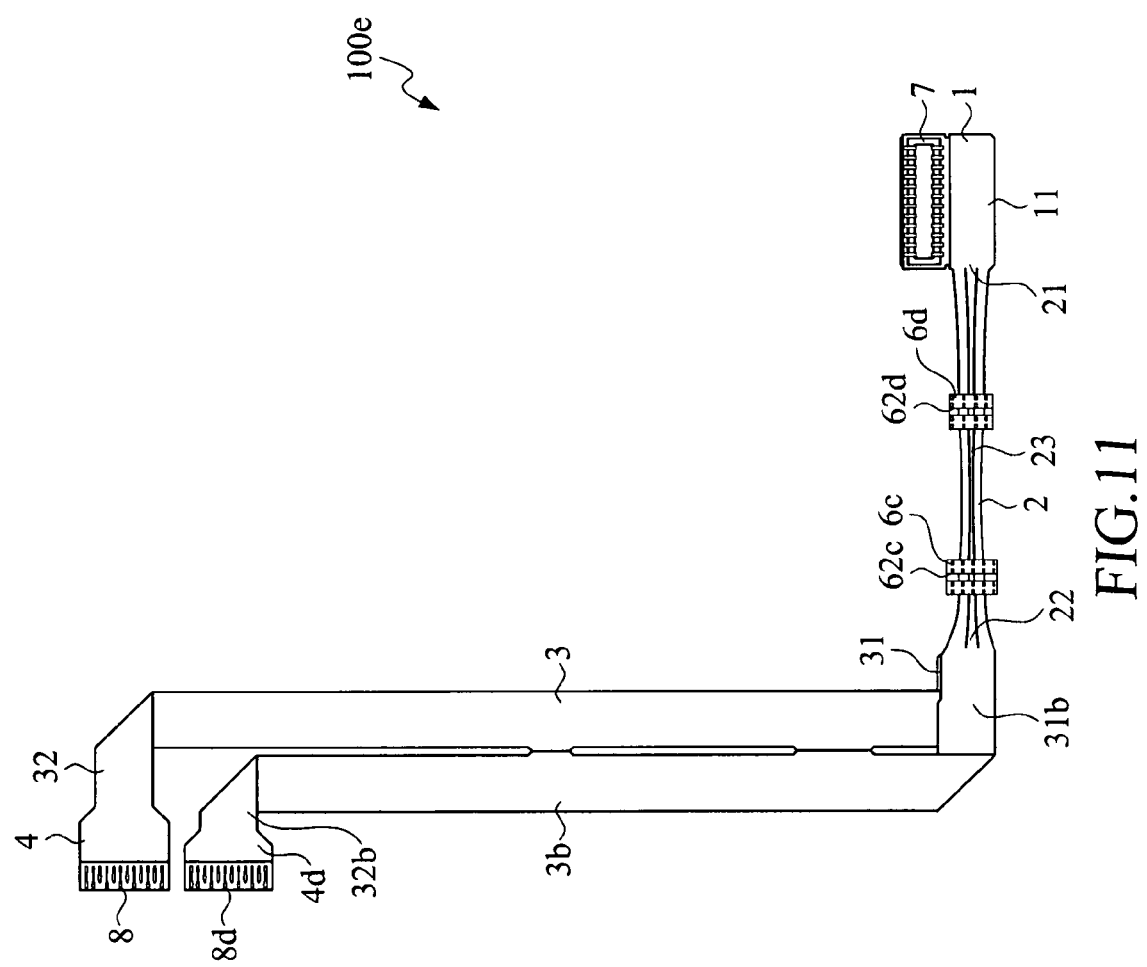
FIG. 11 is a further schematic view showing the use of the sixth embodiment of the present invention.

Referring to FIGS. 9-11, FIG. 9 is a schematic view showing use of the sixth embodiment, FIG. 10 is another schematic view showing the use of the sixth embodiment, and FIG. 11 is a further schematic view showing the use of the sixth embodiment. With the first foldable section 11, the second foldable section 12, the third foldable section 13, the fourth foldable section 14, the fifth foldable section 15, and the three folding lines L1, L3, L4, the foldable sections 11, 12, 13, 14, 15 can be folded and overlapped to combine as a configuration shown in the drawings. And the folded portions are secured by being adhered by the adhering sections 33, 33b of the slip sections 3, 3b, so that the clustered flat cable components 23, 23c of the cluster sections 2, 2c of the flexible-circuit flat cable 100e can be stacked in the form of a bundle as shown in the drawings. Afterwards, the bundling structures 6c, 6d are employed to bundle the clustered flat cable components 23, 23c of the cluster sections 2, 2c together and the fastening sections 61c, 61d of the bundling structures 6c, 6d fasten them together respectively.

The adhering sections 34, 35, 34b, 35b of the slip sections 3, 3b function to respectively and adhesively secure portions of the slip sections 3, 3b when the slip sections 3, 3b are folded by a predetermined angle to have the portions overlapping each other as shown in the drawings. It is apparent to those having ordinary skills in the art that the configuration of the flexible-circuit flat cable 100e shown in FIG. 11 provides only an example of various feasible embodiments and the arrangement and locations of the adhering sections 34, 35, 34b, 35b as shown in the drawings are preferably set according to the needs of the design of electronic products to which the present invention is applied. The configuration of the flexible-circuit flat cable 100e is not limited what shown and discussed, which provides only an example.

Figure 12:
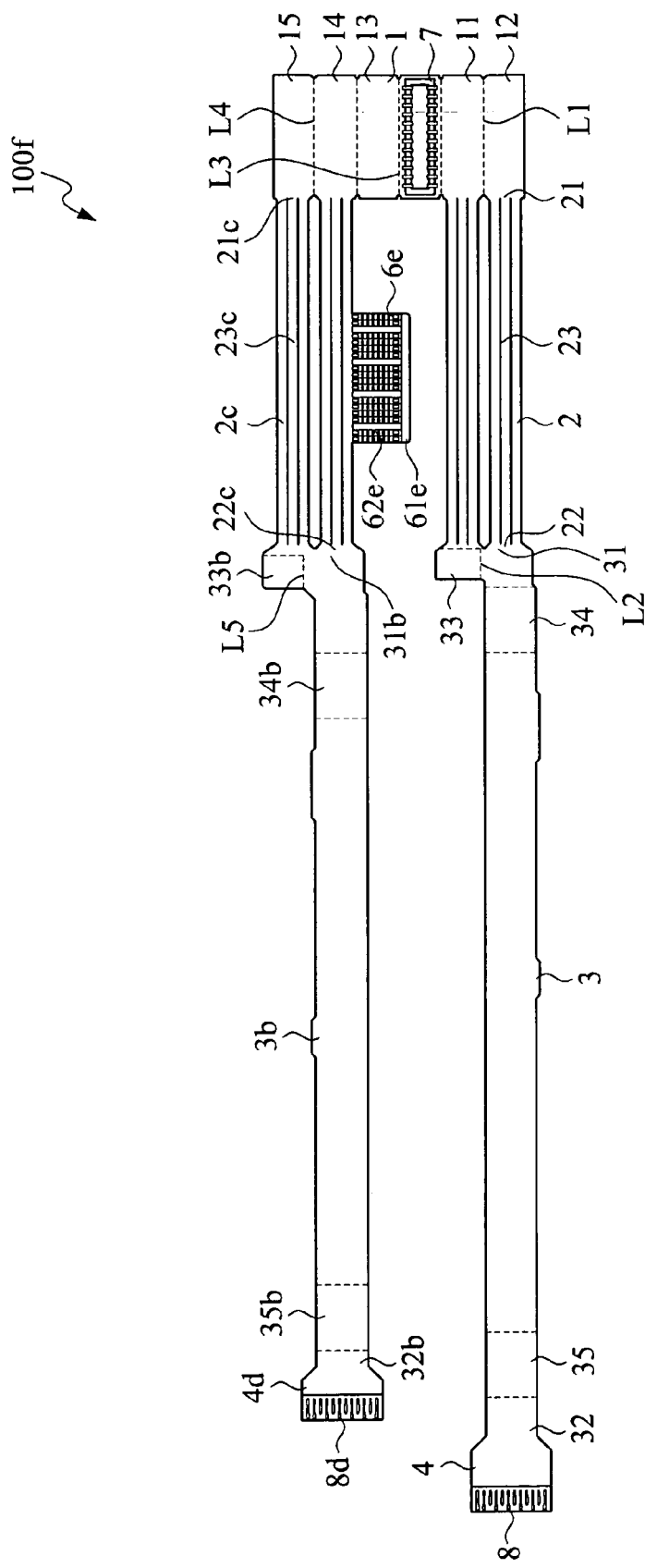
FIG. 12 is a schematic view of a flexible-circuit flat cable constructed in accordance with a seventh embodiment of the present invention.

Referring to FIG. 12, a schematic view of a flexible-circuit flat cable constructed in accordance with a seventh embodiment of the present invention is shown. The flexible-circuit flat cable of the seventh embodiment, generally designated at 100f, is substantially identical to the sixth embodiment in respect of the constituent components thereof, and thus identical components of the two embodiments will carry the same reference numerals for corresponding to each other. The difference between the two embodiments resides in that the bundling structure 6e of the cluster section 2c of the seventh embodiment is elongated and shows the configuration illustrated in the drawing, including an elongated fastening section 61e and a plurality of hollow zones 62e. Since the constituent components and the applications of the seventh embodiment are substantially identical to those of the sixth embodiment, further discussion is of no need herein.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible-circuit flat cable comprising:
   at least one cluster section, which comprises a first end and a second end between which a plurality of signal transmission lines are arranged;
   at least one slip section, which comprises a first end and a second end, the first end of the slip section being connected to the second end of the cluster section, a plurality of signal transmission lines being arranged between the first and second ends of the slip section and respectively connecting to the signal transmission line of the cluster section;
   a first connection section, which is set at the first end of the cluster section, the first connection section comprising a plurality of signal transmission lines respectively connecting to the signal transmission lines of the cluster section; and
   a second connection section, which is set at the second end of the cluster section, the second connection section comprising a plurality of signal transmission lines respectively connecting to the signal transmission lines of the cluster section;
   wherein the cluster section comprises a cluster structure composed of a plurality of clustered flat cable components that is formed by slitting in a direction parallel to extension direction of a flexible circuit board to impose free and independent flexibility for bending to each clustered flat cable component, each clustered flat cable component comprising at least one of the signal transmission lines;
   at least one bundling structure is formed on a lateral side edge of a predetermined clustered flat cable component of the cluster section and the bundling structure forms a fastening section, whereby when the clustered flat cable components of the cluster section of the flexible circuit board are stacked to form a bundled structure, the bundling structure bundles the plurality of clustered flat cable components and is secured by being fastened by the fastening section; and
   the fastening section of the bundling structure comprises an adhesive layer, which adhesively secures the clustered flat cable components when the bundling structure bundles the plurality of the clustered flat cable components.

2. The flexible-circuit flat cable as claimed in claim 1, wherein the first end of the slip section forms at least one additional cluster section extending therefrom.

3. The flexible-circuit flat cable as claimed in claim 1, wherein the second end of the slip section forms at least one cluster section extending therefrom.

4. The flexible-circuit flat cable as claimed in claim 1, wherein the first end of the cluster section forms at least one slip section extending therefrom.

5. The flexible-circuit flat cable as claimed in claim 1, wherein the two ends of the cluster section each form at least one additional connection section.

6. The flexible-circuit flat cable as claimed in claim 1, wherein the first connection section comprises at least one foldable section, the foldable section comprising a folding line.

7. The flexible-circuit flat cable as claimed in claim 1, wherein the first connection section comprises a connector.

8. The flexible-circuit flat cable as claimed in claim 1, wherein the second connection section comprises a connector.

9. The flexible-circuit flat cable as claimed in claim 1, wherein the first connection section comprises a plugging end.

10. The flexible-circuit flat cable as claimed in claim 1, wherein the second connection section comprises a plugging end.

11. The flexible-circuit flat cable as claimed in claim 1, wherein the slip section comprises at least one adhering section.

12. A flexible-circuit flat cable comprising:
    at least one cluster section, which comprises a first end and a second end between which a plurality of signal transmission lines are arranged;
    at least one slip section, which comprises a first end and a second end, the first end of the slip section being connected to the second end of the cluster section, a plurality of signal transmission lines being arranged between the first and second ends of the slip section and respectively connecting to the signal transmission line of the cluster section, the slip section comprises at least one adhering section;
    a first connection section, which is set at the first end of the cluster section, the first connection section comprising a plurality of signal transmission lines respectively connecting to the signal transmission lines of the cluster section; and
    a second connection section, which is set at the second end of the cluster section, the second connection section comprising a plurality of signal transmission lines respectively connecting to the signal transmission lines of the cluster section;
    wherein the cluster section comprises a cluster structure composed of a plurality of clustered flat cable components that is formed by slitting in a direction parallel to extension direction of a flexible circuit board to impose free and independent flexibility for bending to each clustered flat cable component, each clustered flat cable component comprising at least one of the signal transmission lines.

13. The flexible-circuit flat cable as claimed in claim 12, wherein the first end of the slip section forms at least one additional cluster section extending therefrom.

14. The flexible-circuit flat cable as claimed in claim 12, wherein the second end of the slip section forms at least one cluster section extending therefrom.

15. The flexible-circuit flat cable as claimed in claim 12, wherein the first end of the cluster section forms at least one slip section extending therefrom.

16. The flexible-circuit flat cable as claimed in claim 12, wherein the two ends of the cluster section each form at least one additional connection section.

17. The flexible-circuit flat cable as claimed in claim 12, wherein at least one bundling structure is formed on a lateral side edge of a predetermined clustered flat cable component of the cluster section and the bundling structure forms a fastening section, whereby when the clustered flat cable components of the cluster section of the flexible circuit board are stacked to form a bundled structure, the bundling structure bundles the plurality of clustered flat cable components and is secured by being fastened by the fastening section; and the fastening section of the bundling structure comprises an adhesive layer, which adhesively secures the clustered flat cable components when the bundling structure bundles the plurality of the clustered flat cable components.

18. The flexible-circuit flat cable as claimed in claim 12, wherein the first connection section comprises at least one foldable section, the foldable section comprising a folding line.

19. The flexible-circuit flat cable as claimed in claim 12, wherein the first connection section comprises a connector.

20. The flexible-circuit flat cable as claimed in claim 12, wherein the second connection section comprises a connector.

21. The flexible-circuit flat cable as claimed in claim 12, wherein the first connection section comprises a plugging end.

22. The flexible-circuit flat cable as claimed in claim 12, wherein the second connection section comprises a plugging end.

* * * * *